United States Patent [19]

Nagaoka

[11] Patent Number: 4,845,467
[45] Date of Patent: Jul. 4, 1989

[54] KEYBOARD HAVING MICROCOMPUTERIZED ENCODER

[75] Inventor: Shuichi Nagaoka, Iwaki, Japan

[73] Assignee: Alps Electric Co., Ltd., Japan

[21] Appl. No.: 161,439

[22] Filed: Feb. 19, 1988

Related U.S. Application Data

[63] Continuation of Ser. No. 838,882, Mar. 10, 1986, abandoned, which is a continuation-in-part of Ser. No. 504,237, Jun. 14, 1983, abandoned.

[30] Foreign Application Priority Data

Jun. 14, 1982 [JP] Japan .................. 57-101626

[51] Int. Cl.$^4$ ............................................. G06F 3/02
[52] U.S. Cl. ................................ 341/24; 340/365 S; 371/12
[58] Field of Search ............ 340/365 E, 365 S, 365 R; 400/472, 479; 371/12, 62; 364/189, 200, 900

[56] References Cited

U.S. PATENT DOCUMENTS

| | | | |
|---|---|---|---|
| 3,824,383 | 7/1974 | Inose | 371/12 |
| 4,072,852 | 2/1978 | Hogan et al. | 371/12 |
| 4,222,038 | 9/1980 | Magerl | 340/365 S |
| 4,375,036 | 2/1983 | Miller et al. | 340/365 E |
| 4,410,991 | 10/1983 | Lenart | 371/12 |
| 4,488,303 | 11/1984 | Abramovich | 371/12 |
| 4,502,039 | 2/1985 | Vercesi | 340/365 E |
| 4,512,019 | 4/1985 | Bodig et al. | 371/62 |
| 4,513,417 | 4/1985 | Lamb et al. | 371/62 |
| 4,586,179 | 4/1986 | Sirazi et al. | 371/12 |
| 4,586,180 | 4/1986 | Anders et al. | 371/12 |
| 4,591,833 | 5/1986 | Ishii et al. | 400/479 |
| 4,618,953 | 10/1986 | Daniels et al. | 371/12 |
| 4,644,497 | 2/1987 | Tajima et al. | 340/365 E |
| 4,654,821 | 3/1987 | Lapp | 371/12 |
| 4,696,002 | 9/1987 | Schleupen et al. | 371/62 |

FOREIGN PATENT DOCUMENTS 0052452  5/1981  Japan ...................... 371/12

Primary Examiner—Joseph A. Orsino
Assistant Examiner—Brent A. Swarthout
Attorney, Agent, or Firm—Guy W. Shoup; Paul J. Winters; Forrest E. Gunnison

[57] ABSTRACT

A keyboard having an encoder in the form of a microcomputer includes an automatic reset circuit and a key matrix circuit. The microcomputer constantly feeds a key scanning signal to the key matrix and to the automatic reset circuit. If a program used in the microcomputer gets out of control as by external noise, the key scanning signal is ceased. The automatic control circuit detects such stoppage of the key scanning signal that extends over a given period of time, and the circuit then supplies a reset signal to the microcomputer to automatically restart it from the beginning of the program.

3 Claims, 2 Drawing Sheets

KEYBOARD HAVING MICROCOMPUTERIZED ENCODER

This is a continuation application from application Ser. No. 838,882, filed Mar. 10, 1986, now abandoned, which is a continuation-in-part application from application Ser. No. 504,237, filed on June 14, 1983, now abandoned.

FIELD OF THE INVENTION

The present invention relates to a data input keyboard and, more particularly, to a keyboard which has an encoder in the form of a microcomputer which scans the keyboard and is expected to respond to the press of a key on the keyboard.

BACKGROUND OF THE INVENTION

In recent years, keyboard encoders have been increasingly made from microcomputers because of their numerous advantages including decreasing the number of components, ability to offer many functions and serve extensive applications. However, encoders sometimes malfunction due to external noise, such as static electricity, regardless of whether they use conventional or special purpose ICs or consist of microcomputers.

Especially in case of microcomputerized encoders, which use programs, external noise or the like may sometimes cause the programs to jump out of the intended control loop. Once out of control, the keyboard does not perform its functions at all, and it is not possible for the ordinary user to return the computer program to its original state without switching the power source off. Thus, these encoders are affected seriously by external noise or the like.

More specifically, external noise or the like changes the contents of a program counter acting in a microcomputer to control the reading of program instructions, so that the order in which the program is read changes, thus making the proper execution of the program unfeasible. In this way, a so-called "run away program" is created and the keyboard will not respond to user requests.

SUMMARY OF THE INVENTION

Accordingly, it is an object of the present invention to provide a keyboard which uses a microcomputer and detects such a run away program condition, if it occurs, and automatically causes the microcomputer to return to its power up state thus rapidly returning the operation of the keyboard to its normal state.

In microcomputerized keyboard encoders, a continuous rectangular waveform signal is always supplied to the key matrix as a scanning signal and if the program runs away the scanning signal ceases. Thus, more specifically, it is an object of the present invention to provide a means for detecting a stoppage of the scanning signal that extends over a given period of time and automatically causes the microcomputer to reset itself.

Other objects of the invention will appear in the course of the description thereof which follows.

DETAILED DESCRIPTION OF THE INVENTION

Figure 1:
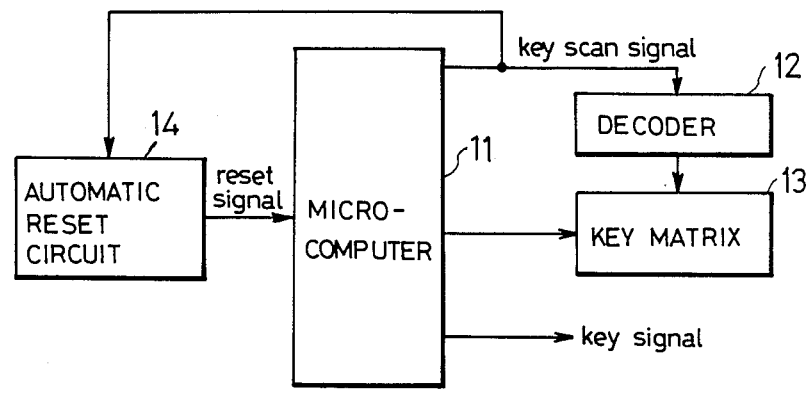
FIG. 1 is a block diagram of a keyboard according to the present invention.

Referring first to FIG. 1, there is shown the general construction of a keyboard embodying the concept of the invention. The keyboard comprises a microcomputer 11 functioning as an encoder, a decoder 12, a key matrix 13 and an automatic reset circuit 14.

The microcomputer 11 constantly generates a key scanning signal which is fed to the key matrix 13 via the decoder and to the reset circuit 14. If a program runs away and the key scanning signal stops, the reset circuit 14 responds to the stoppage and feeds a reset signal to the microcomputer 11. As a result, the microcomputer 11 is reset and restarts its operation from the beginning of the program and the keyboard scanning program is restored.

Conventional keyboards using microcomputers have been constructed that the microcomputers automatically reset to an initial program upon turning on the power supply. In the novel keyboard according to the invention, a circuit is added to perform such an automatic reset operation when a run away program is detected.

Figure 2:
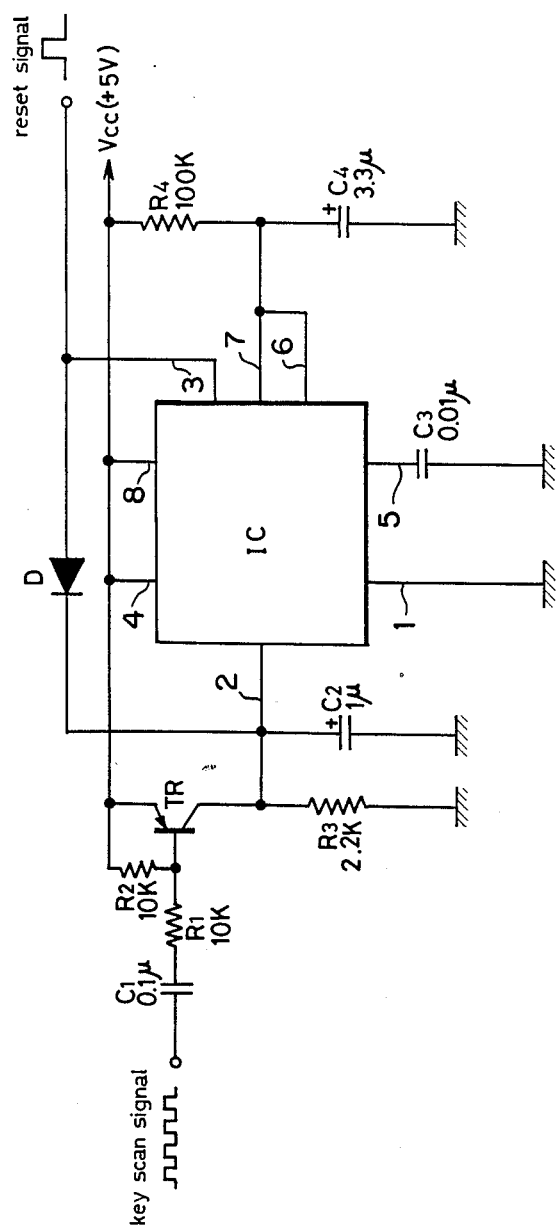
FIG. 2 is a detailed diagram of the automatic reset circuit of the keyboard shown in FIG. 1.

Referring next to FIG. 2, the automatic reset circuit 14 of FIG. 1 is shown in further detail. The reset circuit 14 comprises a switching transistor TR, a universal timer IC of the type used in extensive applications, a capacitor C1 for blocking the dc component of the key scanning signal, a capacitor C2 charged by the key scanning signal and acting to detect this scanning signal, a capacitor C3 for removing noise, a capacitor C4 for detecting the turning on of the power supply, input circuit resistances R1 and R2 of the transistor TR, a resistor R3 for discharging the capacitor C2, a resistor R4 for charging the capacitor C2, and a diode D for the initial charging of the capacitor C2.

Figure 3:
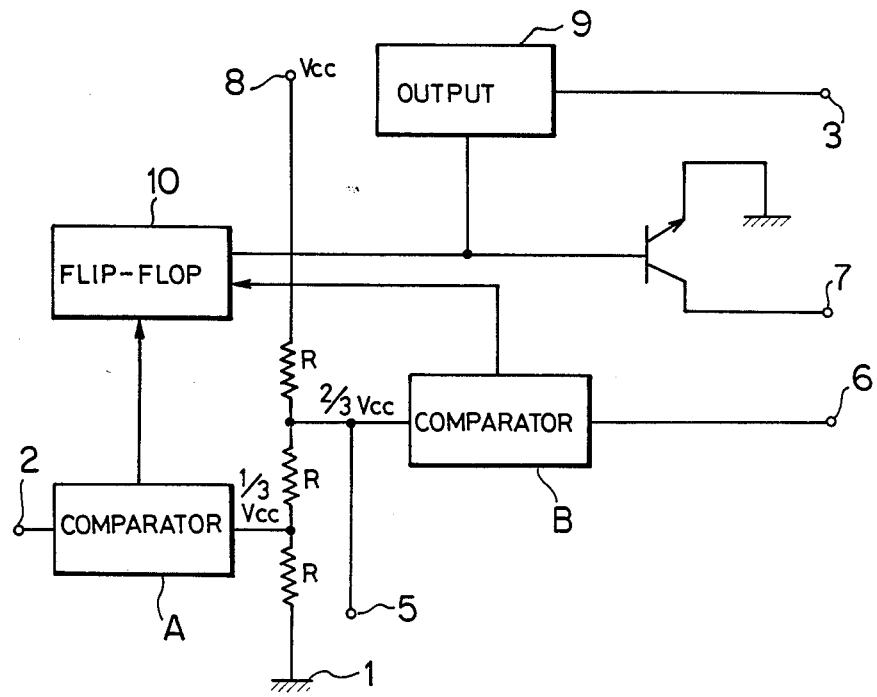
FIG. 3 is an internal circuit diagram of the universal timer of the circuit shown in FIG. 2.

Referring next to FIG. 3, there is shown the inner circuit of the universal timer IC used in the circuit of FIG. 2 and having pins 1–8. Of these pins, pin 1 is a ground terminal and pin 3 is an output terminal of output box 9. When the level at terminal 2 decreases to less than one third of the power supply voltage, as determined by comparator A, the internal transistor to which pin 7 is connected is turned off by flip-flop 10 and the output at the pin 3 assumes "H" level. Pin 4 is a reset terminal and not used in this circuit. Pin 5 determines the level at pin 6 and is not used in this circuit. When the level at the pin 6 exceeds two thirds of the power supply voltage, as determined by comparator A, the transistor to which pin 7 is connected is turned on and the output at the pin 3 assumes "L" level. Pin 7 is a terminal for discharging the capacitor C4 and pin 8 is a terminal of $V_{cc}$-volt supply.

The operation of the automatic reset circuit is as follows:

(i) The power supply is first turned on. Immediately thereafter, the capacitor C2 and C4 store no charge and so the levels at pins 2 and 3 are 0 V. Further, as the level at the pin 2 is lower than one third of $V_{cc}$, the level at the pin 3 immediately assumes "H" level, thereby the internal transistor to which the pin 7 is connected is turned off. The output from the pin 3 is supplied to the microcomputer as a reset output to reset it. The reset signal is also supplied to the capacitor C2 through the diode D so that the capacitor is rapidly charged. The result is that the level at the pin 2 is set to "H" level.

(ii) The capacitor C4 is charged through the resistor R4 and the voltage reaches two thirds of $V_{cc}$ after a certain period of time.

(iii) When the voltage of two thirds of $V_{cc}$ is reached at the capacitor C4 and at the pin 6, the output at the pin 3 is set to "L" level, thus releasing the microcomputer from its reset state to initiate the operation according to the program. At the same time, the transistor to which the pin 7 is connected is turned on. Then the capacitor C4 is rapidly discharged and the level at the pin 6 is set to "L" level. The capacitor C2 is discharged through the resistor R3.

(iv) The time constant determined by C2 and R3 is so set that the voltage at the capacitor C2 is lower than one third of $V_{cc}$ after initiation of key scanning. Therefore, when key scanning is initiated, the capacitor C1 cuts out the dc component of the rectangular waveform signal of key scanning and the transistor TR is intermittently turned on. This causes the capacitor C2 to be charged, and the level at the pin 2 is held at "H" level, so that no reset signal can be generated. It is to be noted that in a case where the key scanning signal is not generated for some reason, the reset signal is repeatedly generated. Usually, the scanning signal will be initiated only if one reset signal is generated.

(v) It is now assumed that the program "runs away" and the key scanning stops. The transistor TR is then not allowed to be turned on and so the change in the capacitor C2 is simply released through the resistor R3 until the voltage is less than one third of $V_{cc}$, whereupon a reset signal is generated. This causes the reset circuit to return to the state (i) above.

The novel automatic reset circuit yields advantages as follows:

(1) It is effective for preventing the so-called "run away program" which would otherwise be caused by external noise, such as static electricity and line noise coming from power lines, or by transient turning on and off of the power supply.

(2) Since the circuit configuration consists of an astable multivibrator, it can be reset with certainty even if the rise conditions of the power supply are bad. That is, the circuit is constructed such that the reset signal is repeatedly produced until the key scanning signal is produced once the power supply is on.

(3) Because the time constant circuits of C2,R3 and C4,R4 are integration circuits, the automatic reset circuit itself is not readily affected by external noise. In particular, a transient signal or noise is changed into a minute signal at the output of an integration circuit after passing through the circuit, and this output signal is so small that the whole circuit is unaffected thereby. That is, the circuit constitutes a stable configuration.

(4) The circuit can be made of a small number of components without using special parts.

While a preferred embodiment of the invention has been described using specific terms, such description is for illustrative purposes only, and it is to be understood that changes and variations may be made without departing from the spirit and scope of the following claims.

What is claimed is:

1. A keyboard for a microcomputer, comprising:
   the keyboard having a key matrix;
   the microcomputer coupled to the key matrix and repeatedly providing an output scanning signal to the key matrix in accordance with a scanning program stored in the microcomputer and which resets to an initial program state when a reset signal is applied thereto; and
   an automatic reset circuit receiving the key matrix scanning signal from the microcomputer and connected to apply a reset signal to said microcomputer, comprised of a circuit including a switching transistor receiving the key matrix scanning signal as an input signal and being intermittently repeatedly turned on thereby, a capacitor and a resistor connected in parallel between a junction point connected to an output of said transistor and ground, said junction point being at a high voltage level when said capacitor is charged by said transistor being intermittently turned on and being dropped to a low voltage level when said capacitor is discharged through said resistor over a predetermined time period by said transistor no longer being intermittently turned on due to a stoppage of said scanning signal for said predetermined time period, and a detector circuit including a universal timer IC having one input terminal connected to said junction point which detects a low voltage level at said junction point and outputs a reset signal in response thereto, whereby stoppage of said scanning signal for a time exceeding the predetermined time period indicating a runaway condition of said microcomputer allows the reset signal to be applied to the microcomputer.

2. A keyboard unit according to claim 1 wherein the detector circuit includes means which cause it to apply a reset signal to the microcomputer when power is first turned on.

3. A keyboard unit according to claim 1 wherein the detector circuit includes means which prevent it from applying a second reset signal for a predetermined period of time after a reset signal is applied to the microcomputer.

* * * * *